United States Patent [19]
Hadden et al.

[11] Patent Number: 5,223,851
[45] Date of Patent: Jun. 29, 1993

[54] APPARATUS FOR FACILITATING INTERCONNECTION OF ANTENNA LEAD WIRES TO AN INTEGRATED CIRCUIT AND ENCAPSULATING THE ASSEMBLY TO FORM AN IMPROVED MINIATURE TRANSPONDER DEVICE

[75] Inventors: Leonard D. Hadden, Minneapolis; Glen L. Zirbes, Silver Lake, both of Minn.

[73] Assignee: Trovan Limited, United Kingdom

[21] Appl. No.: 787,828

[22] Filed: Nov. 5, 1991

Related U.S. Application Data

[63] Continuation-in-part of Ser. No. 710,786, Jun. 5, 1991.

[51] Int. Cl.$^5$ .................. H01Q 1/400; H01Q 1/270; G01S 13/080; H01L 23/060
[52] U.S. Cl. ........................ 343/873; 343/788; 257/701; 342/51; 606/116
[58] Field of Search ............... 340/825.54, 825.34, 340/572, 573; 342/42, 51; 343/702, 787, 788, 873; 357/71, 74; 437/189, 213, 219; 606/116, 117; 257/678, 701, 702

[56] References Cited

U.S. PATENT DOCUMENTS

| | | | |
|---|---|---|---|
| 4,273,859 | 6/1981 | Mones et al. | 357/67 |
| 4,695,926 | 9/1987 | McDermott | 174/DIG. 8 |
| 4,733,289 | 3/1988 | Tsurumaru | 357/54 |
| 4,984,061 | 1/1991 | Matsumoto | 357/68 |
| 4,992,794 | 2/1991 | Brouwers | 340/573 |

FOREIGN PATENT DOCUMENTS

| | | | |
|---|---|---|---|
| 87/04900 | 8/1987 | World Int. Prop. O. | 343/788 |
| 90/14736 | 11/1990 | World Int. Prop. O. | 340/825.54 |

*Primary Examiner*—Rolf Hille
*Assistant Examiner*—Peter Toby Brown
*Attorney, Agent, or Firm*—Rosenblum, Parish & Isaacs

[57] ABSTRACT

A method and apparatus for facilitating interconnection of antenna lead wires to an integrated circuit and encapsulating the assembly to form an improved miniature transponder device including the provision of an additional protective layer of insulation to the top of an integrated circuit chip or die and the provision of enlarged plated electrodes to the surface of the additional insulation to form enhanced bonding pads, such pads being electrically connected through the protective layers to the normal bonding pads of the integrated circuit device. The enhanced bonding pads are made of a soft conductive metal such that external wires to be attached thereto can be bonded to the pads using a thermal compression bonding technique. This invention also extends to a method of encapsulating a transponder in heat shrunk plastics material.

8 Claims, 4 Drawing Sheets

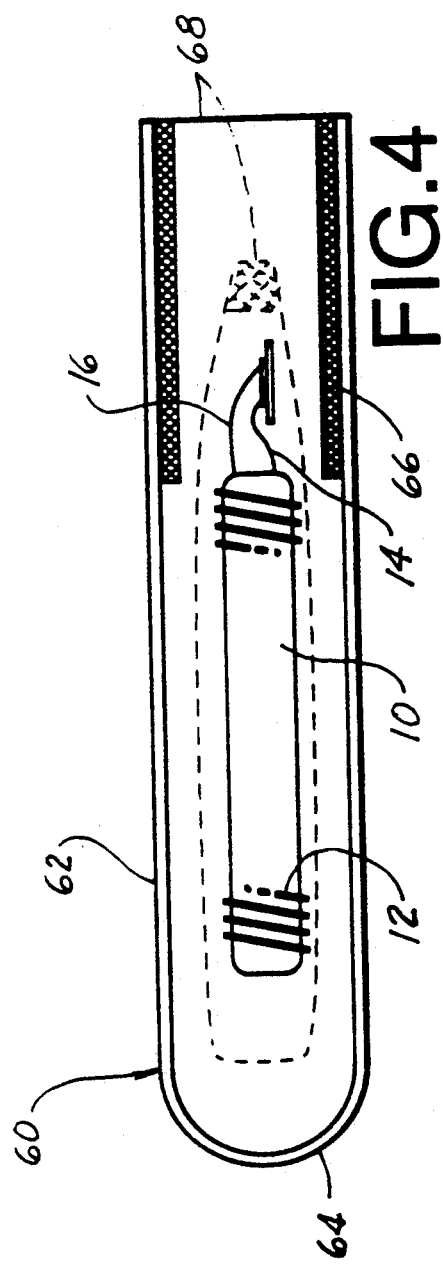
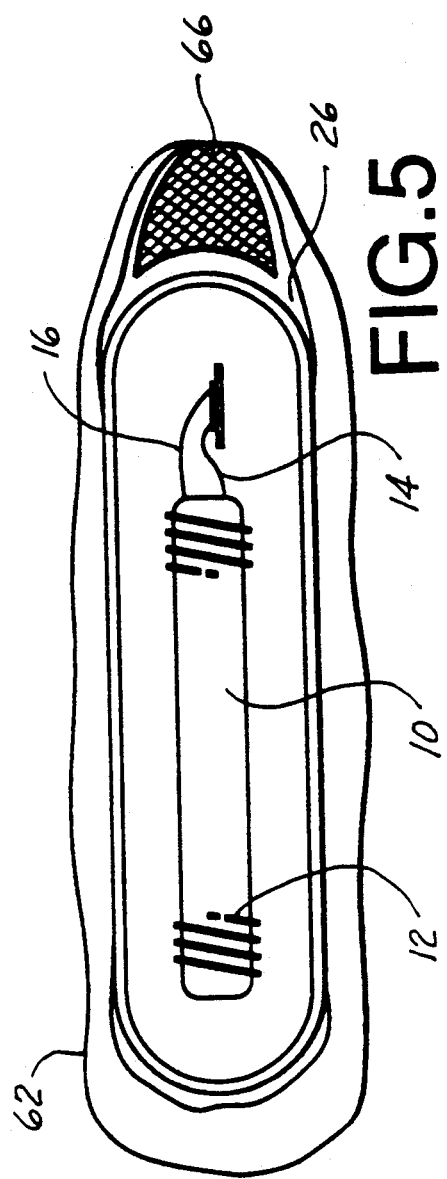

APPARATUS FOR FACILITATING INTERCONNECTION OF ANTENNA LEAD WIRES TO AN INTEGRATED CIRCUIT AND ENCAPSULATING THE ASSEMBLY TO FORM AN IMPROVED MINIATURE TRANSPONDER DEVICE

CROSS REFERENCE TO RELATED APPLICATIONS

This application is a continuation-in-part of U.S. patent application Ser. No. 07/710,786 (filed Jun. 5, 1991) which is pending, entitled "Method of Interconnection to Form Passive Transponder", assigned to the assignee of the present invention.

BACKGROUND OF THE INVENTION

1. Field of the Invention

The present invention relates generally to the manufacture of miniature electronic devices and more particularly to a method and apparatus for facilitating the attachment of electromagnetic antenna wire leads to an integrated circuit chip used in a miniature transponder device suitable for use in a wide variety of applications including implantation in a living animal. This invention further relates to a method of protecting the miniature transponder.

This application further is related to U.S. Pat. No. 5,025,550 (filed May 25, 1990), entitled "Automated Method for the Manufacture of Small Implantable Transponder Devices", assigned to the assignee of the present invention.

2. Brief Description of the Prior Art

As pointed out in the above-identified patent and copending application the disclosures of which are hereby incorporated into this application by references, miniature passive transponders of the type used for object identification, and particularly those which are implantable into living creatures, such as livestock, are very small and have inherent size restrictions that must be considered in their design and manufacture. Most such devices include a wire-wound electromagnetic antenna electrically connected to an integrated circuit which, in response to received transmitted energy obtained from the antenna, generates a response signal which is retransmitted to and through the antenna to a nearby sensor.

Heretofore, the integrated circuit was first mounted to a metal leadframe, potted, and then the potted device having leadframe leads extending therefrom was attached to the antenna by bonding the antenna wires to the leads. The necessity of providing a leadframe and assembling the semiconductor die to the leadframe not only adds to the cost of the device but also has a substantial bearing on the minimum size to which a particular device may be reduced.

In addition, it is necessary to protect the passive transponder from exterior factors such as corrosive environments and mechanically destructive impacts. This is particularly so when the transponder is small and delicate.

However, it is exactly because of the small and delicate nature of the transponders in question that adequate protection is not easy to apply. The need is therefore for a simple and efficient means for protecting the transponder which, when the protection is applied, does not harm the transponder in any way.

SUMMARY OF THE PRESENT INVENTION

It is therefore a principal object of the present invention to provide a means for attaching fine wires directly to an integrated circuit without requiring the use of a leadframe structure.

Another object of the present invention is to provide a more economical means and method for attachment of fine wires to an integrated circuit than has heretofore been available.

Still another object of the present invention is to provide a novel means and method for attaching the antenna wires of a miniature transponder to an integrated circuit chip forming the operative electronic component thereof.

Yet a further object of the present invention is to provide a method for protecting a miniature transponder from environmental and mechanical impact hazards.

Briefly, a preferred embodiment of the present invention includes the provision of an additional protective layer of insulation to the top of an integrated circuit chip or die and the provision of enlarged plated electrodes to the surface of the additional insulation to form enhanced bonding pads, such pads being electrically connected through the protective layers to the normal bonding pads of the integrated circuit device. The enhanced bonding pads are made of a soft conductive metal such that external wires to be attached thereto can be bonded to the pads using a thermal compression bonding technique.

This invention further extends to a method of protecting a transponder by inserting such transponder in a suitable heat shrinkable material and shrinking such material over the transponder.

An important advantage of the present invention is that it reduces the cost and size of a passive transponder device.

Another advantage of the present invention is that it makes possible visible inspection of all circuit connections.

These and other objects and advantages of the present invention will no doubt become apparent to those skilled in the art after having read the following detailed description of the preferred embodiment which is illustrated in the several figures of the drawing.

IN THE DRAWING

FIGS. 4 and 5 illustrate the method of protecting the transponder apparatus of FIG. 1.

DETAILED DESCRIPTION OF THE PREFERRED EMBODIMENTS

Figure 1:
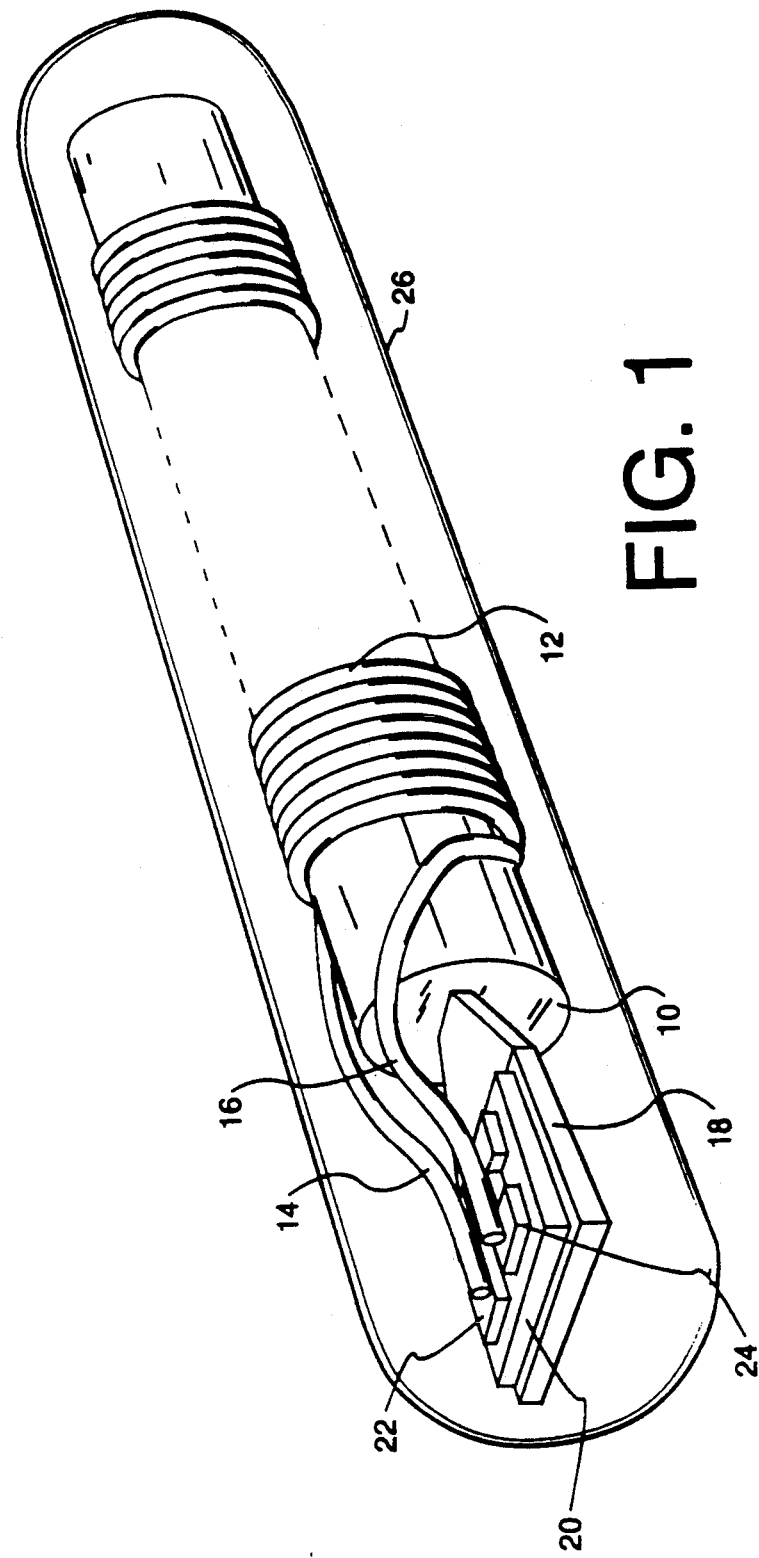
FIG. 1 is a perspective view illustrating an encapsulated transponder apparatus illustrating one application of the present invention.

Referring now to FIG. 1 of the drawing, there is shown a small implantable microtransponder device of the type generally described in the above-mentioned copending application but incorporating the present invention.

More specifically, the illustrated device includes an electromagnetic antenna formed of an elongated cylindrical magnetic core 10 having a length of ultra-fine conductive wire 12 wrapped thereabout with the ends 14 and 16 extending forwardly. One such antenna is disclosed in copending U.S. patent application Ser. No. 400,600, filed Aug. 30, 1989, and assigned to the assignee of the present invention. Affixed to the end of core 10 is a support means 18 to which is attached an integrated circuit die 20 having a pair of contact pads 22 and 24 provided thereon in accordance with the present invention. As depicted, the wire end 14 is conductively bonded to pad 22, and the wire end 16 is conductively bonded to pad 24. For some applications it may be possible to dispense with the support means 18 and depend entirely upon the wires 14 and 16 for support prior to subsequent encapsulation.

Note that since the pads 22 and 24 are installed during the wafer fabrication process, the only post-fab testing that need be undertaken is that relating to the bonding of wires 14 and 16 to the pads 22 and 24 respectively, and this can be easily accomplished using automated test equipment. In other words, the usual testing of chip-to-leadframe connection has been eliminated. After assembly and test, the transponder assembly is encapsulated in a suitable glass or plastic capsule 26 and is at this point ready for implantation in an animal or other object to be identified.

As described in the above-mentioned copending application, the die 20 includes electronic memory and associated modulation circuitry such that in response to power input thereto from the coil 12 generates an identifying signal which is returned to coil 12 for retransmission to a detecting antenna.

Figure 2:
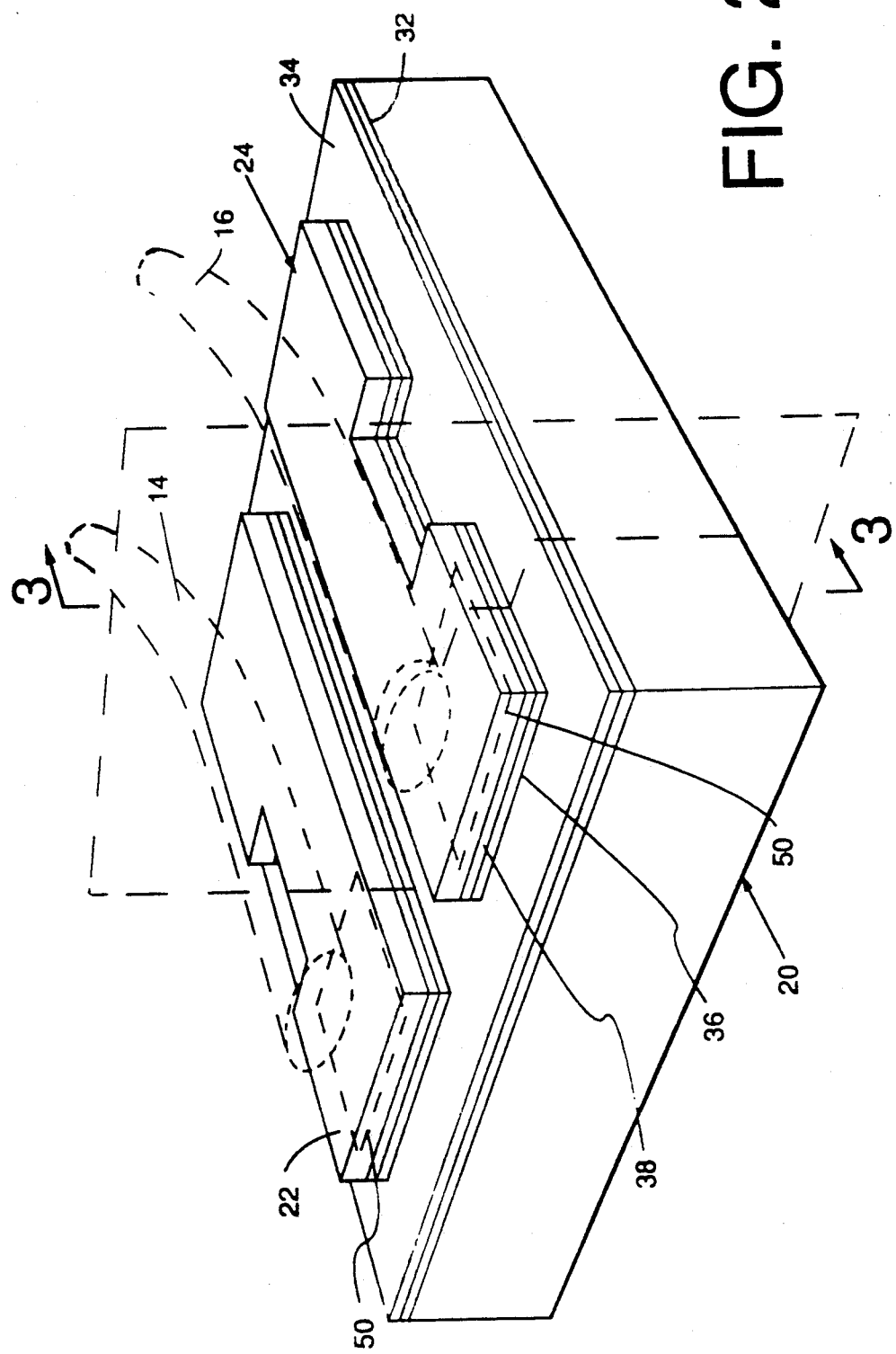
FIG. 2 is a perspective view more clearly illustrating a preferred embodiment of the present invention.

Turning now to FIG. 2 of the drawing, the die 20 is shown in enlarged detail to include a semiconductive substrate 30 having a standard phosphorus-doped glass layer 32 deposited thereon which is overcovered by a second layer of silicon nitride insulation 34 applied by plasma-enhanced deposition. The thickness of layer 34 is at least 15,000 angstroms and provides both insulation and structural protection for the underlying die. After deposition, the layer 34 is masked and two contact areas or holes 50 are etched through the layers 32 and 34 to contact the ac+ and ac— pads (not shown) on the circuit contained in die 20 beneath layer 32. With the contact areas open, the wafer is ready for the fabrication of the enhanced contact pads 22 and 24. The process starts with the deposition of a field metal layer 36 of TiW (approximately 90% Ti and 10% W) having a thickness of approximately 2,000 angstroms. On top of this layer a layer of pure gold of approximately 1,200 angstroms is deposited.

The enhanced contact pads 22 and 24 are then deposited to a thickness of approximately 25 microns of gold or copper. For the particular application illustrated, the pads 22 and 24 are approximately 16 milli-inches long and .6 milli-inches wide and provide adequate surface area to which the fine copper wires 14 and 16 may be attached by soldering, thermal compression bonding or welding. It should be noted that the thick silicon nitride layer 34 is of particular importance to the invention in that the pads 22 and 24 are plated directly over the active circuit area, i.e. the layer 34 serves to protect against damage to the underlying circuitry during the wire lead attachment process which would otherwise render the assembly useless.

Figure 3:
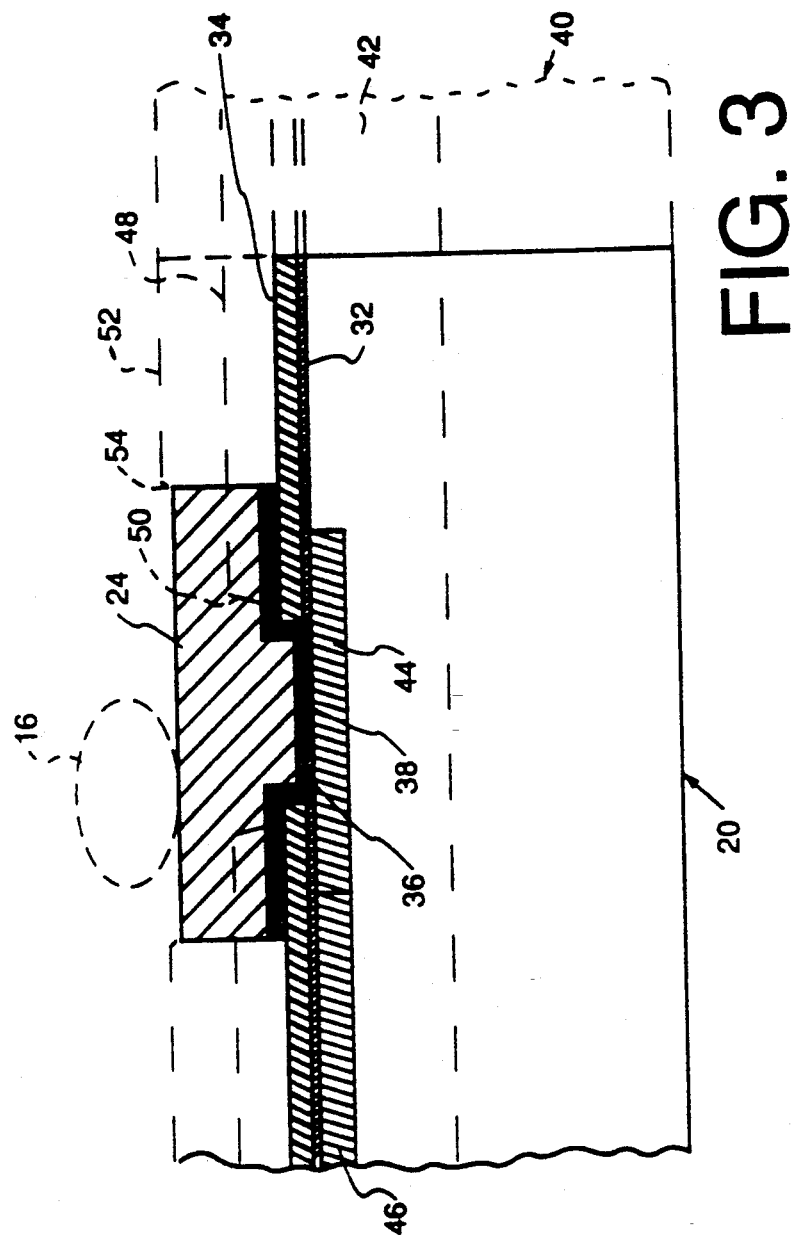
FIG. 3 is a transverse cross-section taken in the plane 3—3 of FIG. 2.

Referring now to FIG. 3 of the drawing, which is a partially broken cross-section taken along the plane 3—3 of FIG. 2, the manufacturing process is further illustrated, it being understood of course that the illustrated die is not fabricated individually but is made jointly with other die, forming a silicon wafer. After fabrication and test, the die 20 is separated from the other die of the wafer. As depicted, the wafer 40 from which the die 20 is cut forms a substrate the upper portion 42 of which has integrated circuit components formed therein. Deposited on the usual upper surface of the wafer and forming a standard electrical interconnect pad 44 is a metallization layer 46. A supporting leadframe is normally electronically connected to pads 44 by fine wires. However, in accordance with the present invention, no such leadframe and connecting wires are required and instead, as described above, after the wafer 40 is covered with the standard phosphorus-doped glass layer 32, it is then covered by a thick extra layer of silicon nitride insulation 34. The wafer is then covered with a layer of photoresist 48, and holes 50 are opened above each pad 44 (as suggested above, there are two for each die) to expose the standard contact pads 44.

After the pads 44 are open, a second layer 52 of photoresist of about 30 microns thickness is deposited over the wafer, and openings 54 are formed therein to define the enhanced pads 22 and 24 and reopen the holes 50. The field metal layers 36 and 38 are then deposited, typically using a DC-diode sputtering process, and subsequently the 25-micron thick enhanced pads 22 and 24 ar electroplated onto the field metal. The photoresist is then removed, and the dies are severed from the wafer to yield the structure illustrated in FIG. 2. It will be understood of course that testing can be accomplished either before the dies are separated or afterwards.

Thereafter the die may be bonded to a support plate 18, as depicted in FIG. 1, and the leads 14 and 16 are attached to the enhanced pads 22 and 24 respectively, by soldering, thermal compression bonding or welding. It will be appreciated that, although the wire attachment operation is made directly to a component part of the die, i.e. the enhanced pads 24 and 26 rather than to leadframes, as described in the previously mentioned copending application, the underlying circuit is protected by a combination of the layer 34 and the structural characteristics of the pads 24 and 26.

In FIG. 4 an encapsulated transponder device is generally indicated as 60. Numerals 10, 12, 14 and 16 refer to the corresponding elements of the transponder referred to in the previous figures. The transponder is located within a tube 62 which has been preformed with one end closed at 64. Insertion of the transponder into the tube 62 can be accomplished by any suitable mechanical placing means.

The tube 62 is made of a heat shrinkable material such as heat shrinkable polyvinylidene fluoride. In addition, the inside surface of the tube 62 may be partially or fully coated with a thermal plastic 66. In the event that the encapsulated transponder is to be inserted into a living body, the heat shrinkable material would need to be inert or further coated by an inert material.

Once the transponder is positioned within the tube 62 heat is applied to the tubing which then shrinks around and protects the transponder. The thermal plastic 66, when subjected to heat, softens and flows to seal the open end 68 of the tube. As a result of this procedure, the transponder is encapsulated within a rigid and durable plastic container and is entirely sealed off, partially by the thermal plastic 66 and partially by the heat shrunk tube 62, from adverse environmental influences.

The post shrinking format of the tube and thermal plastic is shown in broken lines in FIG. 4.

Although the use of the heat shrink plastic is known for encapsulating electronic devices (see U.S. Pat. Nos. 3,603,720 and 4,695,926), the prior art encapsulated devices have leads protruding therefrom which makes hermetic encapsulation very difficult. The transponder of the invention has no leads protruding beyond the outer extremities of the tube 62 and this feature together with the use of a thermal plastic makes this advantageous encapsulation of the transponder a non-obvious application of the heat shrinking plastics technology.

Turning now to FIG. 5 it will be seen that the transponder in this case is located within a glass capsule 26 very much the same as illustrated in FIG. 1. In this figure, the transponder together with the capsule has been inserted within a heat shrinkable tube 62. As illustrated, the tube 62 has already been shrunk and the thermal plastic has flowed to form a plug 66 at what was the open end of the tube 62. The choice of encapsulating the transponder in only a heat shrink plastic or a combination of glass capsule and heat shrink plastic will depend on the specific uses that the device needs to be put to.

The advantage of using this method of protecting the transponder lies in that it is technically complex to use conventional plastic molding techniques to mold a plastic envelope around the transponder. This is because it is difficult to hold the transponder in the center of the mold cavity, which is necessary to achieve an adequate plastic wall thickness about the transponder. Insertion of the transponder into a preferred heat shrinkable plastics tube avoids these difficulties.

Furthermore, the transponder device referred to in this description could be as small as 10 mm in length and 1.5 mm in diameter. This very small size makes the transponder extremely delicate and difficult to work with and effectively prevents the use of any encapsulation techniques that will damage it. The method of this invention is very well suited to encapsulation of a transponder such as this.

Although the present invention has been described in terms of an embodiment particularly suited for use in the fabrication of a microtransponder device, the same process can be used to make devices for a wide variety of applications.

Furthermore, although the present invention has been described above in terms of a single preferred embodiment, it is anticipated that numerous alterations and modifications thereof will become apparent to those skilled in the art. It is therefore intended that the appended claims be interpreted broadly as covering 11 such alterations and modifications as fall within the true spirit and scope of the invention.

What is claimed is:

1. An encapsulated miniature transponder device, comprising:
    an integrated circuit device, including:
        a silicon substrate forming a die having an integrated circuit formed in a surface thereof and including a metallization layer forming a first set of contact pads;
        an insulative layer covering the surface of said die including said metallization layer and having apertures therein exposing said first contact pads; and
        a plurality of second contact pads disposed over said insulative layer and contacting said first pads through said apertures;
    an antenna connected to said second contact pads;
    encapsulating means including a glass capsule hermetically enclosing said integrated circuit device and said antenna and a plastic container heat-shrunk about said capsule, the plastic container being of inert material suitable for use in a live body.

2. An integrated circuit device as recited in claim 1 wherein said insulative layer has a thickness in excess of 10,000 angstroms.

3. An integrated circuit device as recited in claim 2 wherein the thickness of said second pads is in excess of 20 microns.

4. An integrated circuit device as recited in claim 3 wherein said integrated circuit device forms the signal generating circuitry of the transponder device.

5. An integrated circuit device as recited in claim 4, wherein said antenna comprises wire leads bonded to said second pads.

6. A leadless passive transponder comprising:
    a signal generator, a signal transmitter, and a coupling means adapted to inductively couple to a force field so that variation of the force field relative to the coupling means generates an electronic current within at least the generator, said generator, transmitter and coupling means being encapsulated in a glass capsule which is in turn encapsulated in a heat shrunk material.

7. A transponder as recited in claim 6 wherein the heat shrunk material is, before being applied to encapsulate the transponder, in the form of a hollow tube which is closed at one end.

8. A transponder as recited in claim 7 wherein the tube includes a thermal plastic which when heat is applied to the tube flows to seal the open end of the tube.

* * * * *